United States Patent [19]

Hiruma

[11] Patent Number: 5,235,505
[45] Date of Patent: Aug. 10, 1993

[54] OVERCURRENT DETECTOR
[75] Inventor: Atsuyuki Hiruma, Fuji, Japan
[73] Assignee: Kabushiki Kaisha Toshiba, Kawasaki, Japan
[21] Appl. No.: 707,343
[22] Filed: May 29, 1991
[30] Foreign Application Priority Data
May 31, 1990 [JP] Japan .................... 2-141881
[51] Int. Cl.⁵ ............................ H02H 7/12
[52] U.S. Cl. ........................ 363/56; 363/37; 323/902; 361/111
[58] Field of Search ........... 323/902; 363/55–58, 363/37, 131, 132; 361/18, 90, 91, 111

[56] References Cited
U.S. PATENT DOCUMENTS
4,158,163  6/1979  Eriksen et al. .............. 363/37 X FOREIGN PATENT DOCUMENTS
60-13478   1/1985  Japan .
61-132080  6/1986  Japan .

Primary Examiner—Emanuel T. Voeltz
Attorney, Agent, or Firm—Foley & Lardner

[57] ABSTRACT

There are provided a resistor having a low resistance and inserted in a d.c. current path of which an overcurrent is detected, and a bias circuit for generating substantially a constant d.c. voltage. A voltage obtained by superposing a voltage across the resistor upon a voltage supplied from the bias circuit is monitored. When the monitored voltage reaches a predetermined threshold value, an overcurrent detection signal is generated by means of a photocoupler.

5 Claims, 3 Drawing Sheets

OVERCURRENT DETECTOR

FIELD OF THE INVENTION

The present invention relates to an overcurrent detector for detecting an overcurrent in accordance with a voltage generated across a resistor having low resistance inserted in a d.c. current circuit.

BACKGROUND OF THE INVENTION

FIG. 1 is a circuit diagram showing the outline of a conventional inverter apparatus having an overcurrent detector. In FIG. 1, an a.c. current from an a.c. power source 1 is rectified by a rectifier 2, smoothed by a smoothing capacitor 3, and supplied to a voltage type inverter 4. The inverter 4 is constructed of power transistors $GT_1$ to $GT_6$ connected in three-phase arrangement. An a.c. output from the inverter is supplied to an a.c. motor 5. The a.c. motor drives, for example, a compressor 5A at the freezing cycle. A frequency command for the inverter 4 is applied to a controller 6. This controller 6 generates an on-signal and off-signal in accordance with the frequency command. In accordance with this on-signal and off-signal, a driver 7 controls the power transistors $GT_1$ to $GT_6$. The power transistors $GT_1$ to $GT_6$ constituting the inverter 4 have current circulating diodes $D_1$ to $D_6$ connected in antiparallel to the transistors. Of the driver 7 for driving the power transistors $GT_1$ to $GT_6$, a circuit portion for driving, for example, the power transistor $GT_2$ is constructed of a pair of serially connected transistors and a reverse bias circuit. The interconnection point between the pair of serially connected transistors is connected to the base of the power transistor $GT_2$. The reverse bias circuit is connected to the negative side of the pair of serially connected transistors and the emitter of the power transistor $GT_2$, and is constructed of a parallel circuit of a capacitor $C_{11}$ and a serial circuit $D_{11}$ of diodes.

A resistor $R_1$ having low resistance is inserted in a d.c. current path at the negative side to detect an overcurrent of the inverter 4. The resistor $R_1$ is connected in parallel with a light emitting diode ED which constitutes a photocoupler 8 together with a phototransistor PT. The phototransistor PT is applied with a d.c. power source $V_{DD}$ via a resistor $R_2$. These circuit elements constitute an overcurrent detector.

If a current passing through the inverter 4 becomes in excess of a threshold value in accordance with which an overcurrent is determined, the light emitting diode ED of the photocoupler 8 emits light so that the resistance of the phototransistor PT becomes very small. As a result, the potential at the interconnection between the phototransistor PT and the resistor $R_2$ lowers to an "L" level so that an overcurrent detection signal $S_{oc}$ is supplied to the controller 6 to protect the inverter 4. Upon reception of the overcurrent detection signal $S_{oc}$, the controller 6 performs a protection operation such as lowering an inverter output, or cutting off all the power transistors $GT_1$ to $GT_6$.

In the conventional over current detector described above, the light emitting diode ED of the photocoupler 8 generally has a light emission limit voltage of 1.0 resulting from its characteristic. Assuming that the threshold value for detecting an overcurrent is 14.5 A, the resistor $R_1$ must have a resistance value satisfying the following equation.

$$1.0/14.5 = 0.069 \, \Omega \tag{1}$$

The power loss by the resistor $R_1$ is therefore $$14.5^2 \times 0.069 = 14.5 \, W \tag{2}$$

It is apparent that considerable heat is generated by this power loss 14.5 W. During a normal operation, although such an excessive current does not flow, there is a power loss near 14.5 W. The operation efficiency is lowered correspondingly, and some countermeasure against heat generation must be provided.

SUMMARY OF THE INVENTION

It is an object of the present invention to provide an overcurrent detector capable of reducing the power loss by a resistor inserted in a d.c. current path to thereby improve the operation efficiency and dispensing with a countermeasure against heat generation.

In order to achieve the above object of this invention, in an overcurrent detector for detecting an overcurrent flowing through a d.c. current path in accordance with a voltage across a resistor having low resistance and inserted into the d.c. current path, there is provided biasing means for superposing substantially a constant d.c. voltage upon the voltage across the resistor.

A bias circuit generates a voltage having the same polarity as that of the voltage across the resistor in the d.c. current path, and superposes the generated voltage to the voltage across the resistor. An overcurrent is then detected in accordance with the obtained voltage. Therefore, the voltage across the resistor can be lowered for the detection of an overcurrent, allowing for the use of a resistor having low resistance, reduced power loss, and suppressed heat generation.

The biasing means is constituted by a diode and a d.c. power source for supplying a forward current to the diode. The forward voltage of the diode is superposed upon the voltage across the resistor.

A bias voltage across the diode can be generated by supplying a forward current thereto, resulting in a simple circuit arrangement.

Another example of the biasing means is constituted by a voltage generation type photocoupler for generating a voltage across a light receiving element upon light emission of a light emitting element, a power source for supplying a forward current to the light emitting element of the voltage generation type photocoupler, and a Zener diode inversely connected in parallel with the light receiving element of the voltage generation type photocoupler. The voltage across the light receiving element of the voltage generation type photocoupler is limited by the Zener diode. The limited voltage is superposed upon the voltage across the resistor.

Still other example of the biasing means is constituted by a pulse transformer to which a clock pulse is applied, a rectifier for rectifying an output voltage of the pulse transformer, a capacitor which is charged by the voltage obtained by the rectifier, and a Zener diode connected in antiparallel with the capacitor. The charge voltage of the capacitor limited by the Zener diode is superposed upon the d.c. voltage across the resistor.

The latter two biasing means provide a bias voltage by using a power source electrically insulated from a main circuit.

BRIEF DESCRIPTION OF THE DRAWINGS

In the accompanying drawings.

DETAILED DESCRIPTION OF THE PREFERRED EMBODIMENTS

Figure 1:
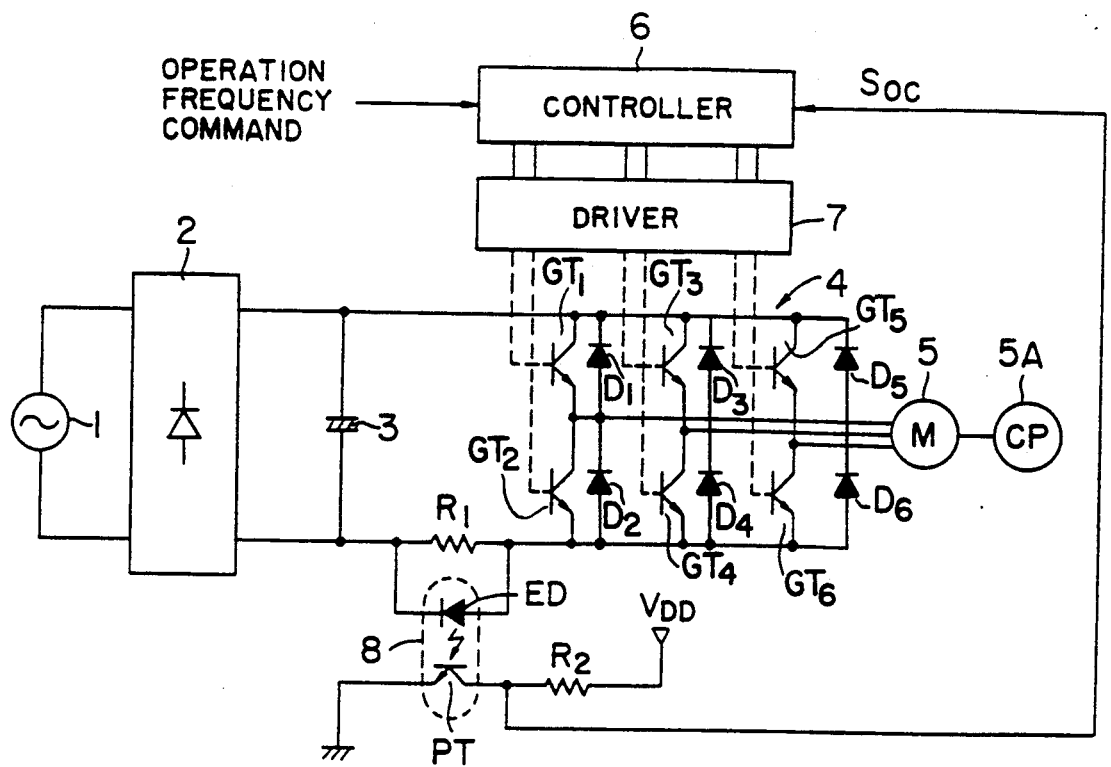
Fig. 1 is a circuit diagram showing a conventional overcurrent detector having an inverter.
Figure 2:
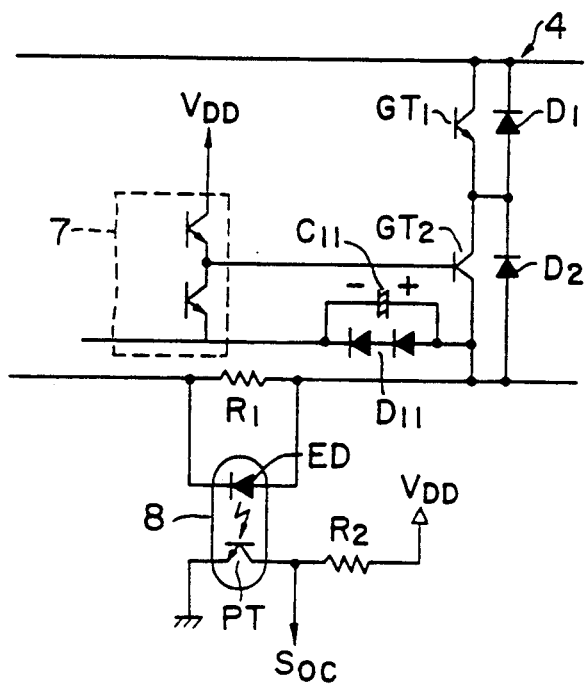
Fig. 2 is a detailed circuit diagram showing a circuit portion of the overcurrent detector shown in Fig. 1.
Figure 3:
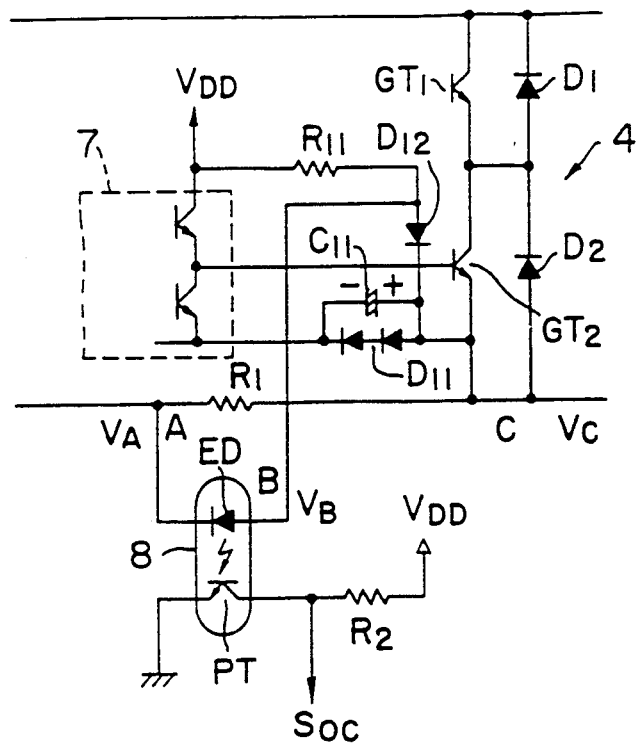
FIG. 3 is a circuit diagram showing an overcurrent detector according to an embodiment of this invention.

FIG. 3 is a circuit diagram of an overcurrent detector according to an embodiment of this invention, similar to FIG. 2. In FIG. 3, like elements to those shown in FIG. 2 are represented by using identical reference numerals. The difference points of the detector shown in FIG. 3 from the detector shown in Fig. 2 are as follows. A serial circuit of a resistor $R_{11}$ and a diode $D_{12}$ is connected between a d.c. power source $V_{DD}$ of a drive circuit 7 and a negative power source line commonly connecting the emitters of power transistors $GT_2$, $GT_4$, and $GT_6$ constituting an inverter 4. The anode of a light emitting diode ED of a photocoupler 8 is connected to the interconnection between the resistor $R_{11}$ and the diode $D_{12}$.

The resistor $R_{11}$, diode $D_{12}$, and diode serial circuit $D_{11}$ are connected in series relative to the d.c. power source $V_{DD}$. The value of the resistor $R_{11}$ is set such that the voltage across the diode serial circuit $D_{11}$ does not change even if the resistor $R_{11}$ and diode $D_{12}$ are added. Accordingly, a constant voltage, e.g., 0.6 V, can always appear across the diode $D_{12}$.

Represented by $V_A$ is a potential at a point A where the cathode of the light emitting diode ED of the photocoupler 8 is connected, i.e., a potential at the resistor $R_1$ on the power source side. Represented by $V_B$ is a potential at a point B where the anode of the light emitting diode ED of the photocoupler 8 is connected, i.e., a potential at the interconnection between the resistor $R_{11}$ and the diode $D_{12}$. Represented by $V_C$ is a potential at a point C, i.e., a potential at the resistor $R_1$ on the inverter 4 side. The potential $V_B$ at the point B is higher than the potential $V_C$ at the point C by the amount of the forward voltage 0.6 V across the diode $D_{12}$. Assuming that the light emission voltage of the light emitting diode ED of the photocoupler 8 is 1.0 V, the resistance of the resistor $R_1$ necessary for the detection of an overcurrent threshold 14.5 A on the main circuit is given by $$(1.0 - 0.6)/14.5 = 0.028 \ \Omega \quad (3)$$

The power loss by the resistor $R_1$ is therefore $$14.5^2 \times 0.028 = 5.9 \ W \quad (4)$$

The power loss can be suppressed by more than one half that of a conventional overcurrent detector, namely 14.5 W given by the equation (2).

In the above manner, the operation efficiency of the inverter can be improved while suppressing heat generation.

With low heat generation, both the threshold values heretofore set differently for 15 A power transistors and 20 A power transistors can be set to the same value of 14.5 A. Accordingly, same service boards may be used for both the cases.

Figure 4:
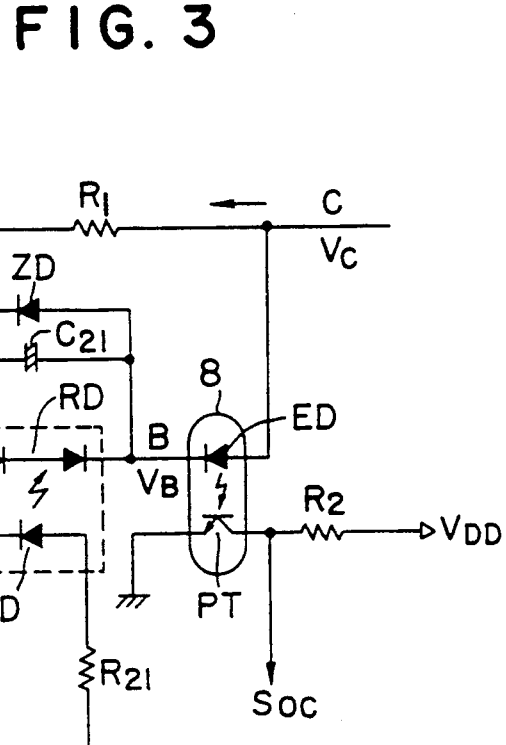
FIG. 4 is a circuit diagram showing an overcurrent detector according to another embodiment of this invention.

FIG. 4 is a circuit diagram of another embodiment of the overcurrent detector. A voltage generation light receiving diode RD of a voltage generation type photocoupler 9 is serially connected to a light emitting diode ED of a photocoupler 8. The light receiving diode RD is connected via a resistor $R_{22}$ to a parallel circuit of a capacitor $C_{21}$ and a Zener diode ZD. A light emitting diode ED of the voltage generation type photocoupler 9 is connected via a resistor $R_{21}$ to a d.c. power source $V_{22}$.

As a current is supplied from the d.c. power source $V_{DD}$ to the light emitting diode ED of the photocoupler 9, the light emitting diode ED emits light to thereby generate a voltage corresponding to the light intensity across the light receiving diode RD. The Zener diode ZD limits this voltage, and the capacitor $C_{21}$ stabilizes this voltage.

Represented by $V_A$ is a potential at a point A of the resistor $R_1$ on the power source side, represented by $V_B$ is a potential at a point B to which the cathode of the light emitting diode ED of the photocoupler 8 is connected, and represented by $V_C$ is a potential at a point C of the resistor $R_1$ on the inverter 4 side.

As a predetermined current is supplied to the light emitting diode ED of the photocoupler 9, a voltage is generated with a higher potential at the point A than at the point B. Namely, the voltage $V_{AB}$ at the point A relative to the point B is given by $$V_{AB} = V_A - V_B > 0 \quad (5)$$

A voltage $V_{CB}$ across the light emitting diode ED of the photocoupler 8 is therefore given by $$V_{CB} = V_{AB} + V_{CA} \quad (6)$$

The voltage across the light emitting diode ED of the photocoupler 8 is therefore a voltage obtained by superposing the voltage across the resistor $R_1$ upon the voltage across the photocoupler 9. Assuming that the output voltage of the photocoupler 9 is 0.5 V, the resistance of the resistor $R_1$ for detecting a main circuit current of 14.5 A is given by $$0.5/14.5 = 0.0345 \ \Omega \quad (7)$$

The power loss by the resistor $R_1$ is therefore $$14.5^2 \times 0.0345 = 7.25 \ W \quad (8)$$

The power loss and heat generation by the resistor $R_1$ can be therefore suppressed by about one half that of a conventional overcurrent detector.

In this embodiment, since the voltage generation type photocoupler 9 is used for generating a bias voltage of the photocoupler 8, the power source for the light emitting diode ED of the photocoupler 9 can be electrically insulated from the main circuit.

Figure 5:
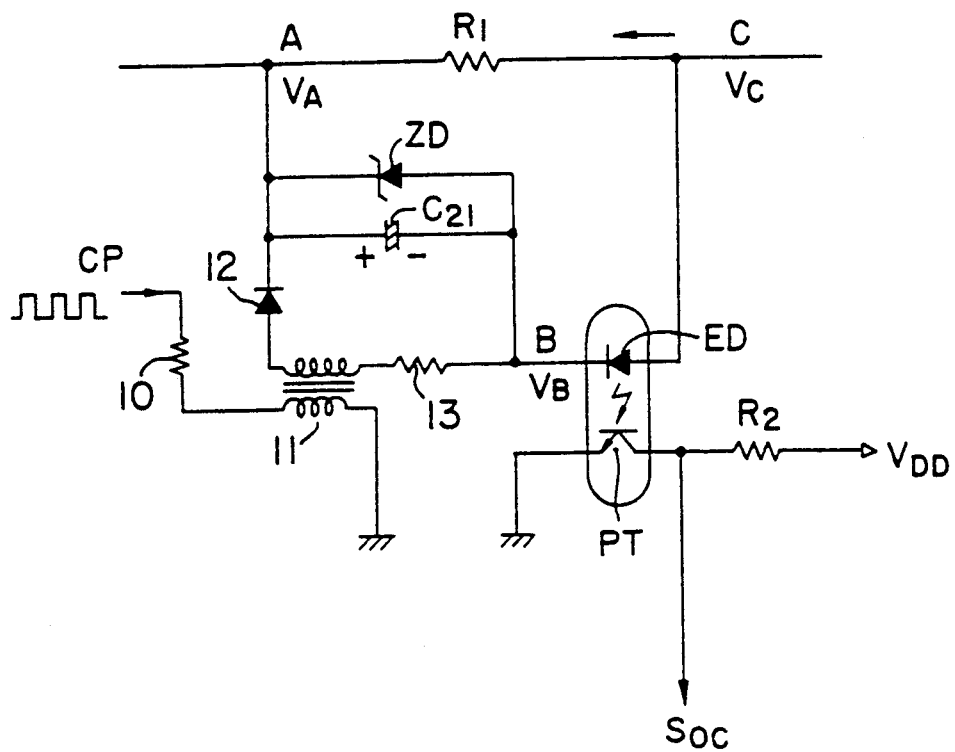
FIG. 5 is a circuit diagram showing an overcurrent detector according to still another embodiment of this invention.

FIG. 5 shows another embodiment which is a modification of the embodiment shown in FIG. 4. In this embodiment, in place of the photocoupler shown in FIG. 4, a bias voltage is generated by using clock pulses CP generated by a Central Processing Unit (CPU) (not shown) of a microcomputer to be used for the control of various apparatuses. The clock pulse CP is applied to the primary winding of a pulse transformer 11 via a resistor 10. A voltage induced across the secondary winding of the pulse transformer 11 charges a capacitor $C_{21}$ by means of a rectifier 12 and a resistor 13. The other circuit portion is the same as the embodiment shown in FIG. 4.

In the above embodiments, detecting an overcurrent of an inverter for an air conditioning apparatus has been described illustratively. This invention is not intended to be limited thereto, but the invention is applicable to general apparatuses for detecting an overcurrent in a d.c. current path.

What is claimed is:

1. An overcurrent detector comprising:
   a resistor having a low resistance inserted in a d.c. current path in which an overcurrent is detected;
   biasing means for generating substantially a constant d.c. voltage; and
   detecting means for generating an overcurrent detection signal when a sum of a d.c. voltage across said resistor and a d.c. voltage generated by said biasing means reaches a predetermined threshold vale, said detecting means including a photocoupler constructed of a light emitting element and a light receiving element, a sum of a d.c. voltage across said resistor and a d.c. voltage generated by said biasing means being applied. to said light emitting element, and said overcurrent detection signal being outputted from said light receiving element.

2. An overcurrent detector according to claim 1, wherein said light receiving element changes its resistance value when it receives light from said light emitting element.

3. An overcurrent detector according to claim 1, wherein said biasing means includes a diode, and a d.c. power source for supplying a forward current to said diode, and a forward voltage across said diode is superposed upon a voltage across said resistor.

4. An overcurrent detector according to claim 1, wherein said biasing means comprises:
   a voltage generation type photocoupler constructed of a light emitting element and a light receiving element for generating a voltage upon light emission of said light emitting element;
   a d.c. power source for supplying a forward current to said light receiving element of said voltage generation type photocouple; and
   a Zener diode inversely connected in parallel with said light receiving element of said voltage generation type photocoupler,
   a voltage generated at said light receiving element of said voltage generation type photocoupler and limited by said Zener diode being superposed upon a d.c. voltage across said resistor.

5. An overcurrent detector according to claim 1, wherein said biasing means comprises:
   a pulse transformer to which a clock pulse is applied;
   means for rectifying an output voltage of said pulse transformer;
   a capacitor which is charged by a voltage obtained by said rectifying means; and
   a Zener diode inversely connected in parallel with said capacitor,
   a charge voltage across said capacitor limited by said Zener diode being superposed upon a d.c. voltage across said resistor.

* * * * *